United States Patent
Kaneko

(10) Patent No.: US 7,220,952 B2
(45) Date of Patent: May 22, 2007

(54) ELECTRO-OPTICAL ELEMENT AND METHOD FOR MANUFACTURING THEREOF, OPTICAL MODULE AND METHOD FOR DRIVING THEREOF

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 27 days.

(21) Appl. No.: 10/892,372

(22) Filed: Jul. 16, 2004

(65) Prior Publication Data

US 2005/0056772 A1  Mar. 17, 2005

(30) Foreign Application Priority Data

Jul. 23, 2003  (JP) ............... 2003-278177

(51) Int. Cl.
- G01J 1/32 (2006.01)
- H01L 27/15 (2006.01)
- H01L 33/00 (2006.01)
- H01S 3/08 (2006.01)

(52) U.S. Cl. .......................... 250/205; 257/80; 257/81; 372/96

(58) Field of Classification Search ................. 372/96, 372/31, 50.21; 257/80, 81; 250/205
See application file for complete search history.

(56) References Cited

U.S. PATENT DOCUMENTS

| 5,606,572 | A | 2/1997 | Swirhun et al. ............... 372/96 |
| 5,892,786 | A * | 4/1999 | Lott ........................ 372/50.124 |
| 5,912,913 | A * | 6/1999 | Kondow et al. .......... 372/45.01 |
| 6,001,664 | A | 12/1999 | Swirhun et al. ............... 438/31 |
| 6,452,669 | B1 * | 9/2002 | Morris et al. ................ 356/215 |
| 6,597,720 | B2 | 7/2003 | Kondo |
| 6,670,599 | B2 * | 12/2003 | Wagner et al. ........... 250/214.1 |
| 6,792,179 | B2 * | 9/2004 | Lu et al. ........................ 385/33 |
| 2002/0003231 | A1 * | 1/2002 | Sun et al. ...................... 257/59 |
| 2002/0044582 | A1 | 4/2002 | Kondo .................... 372/46.01 |
| 2002/0185588 | A1 | 12/2002 | Wagner et al. ........... 250/214.1 |

FOREIGN PATENT DOCUMENTS

| EP | 0 760 544 A1 | 3/1997 |
| JP | 62-143486 | 6/1987 |
| JP | A 10-135568 | 5/1998 |
| JP | 2000-067449 | 3/2000 |
| JP | 2000-101185 | 4/2000 |
| JP | 2000-269585 | 9/2000 |
| JP | 2002-504754 | 2/2002 |
| JP | 2002-169004 | 6/2002 |
| WO | WO 99/43056 | 8/1999 |

OTHER PUBLICATIONS

Liu et al., "Chip-scale Integration of VDSEL, Photodetector, and Microlens Arrays," *The International Society for Optical Engineering SPIE-INT*, vol. 4652, pp. 11-18, 2002.

* cited by examiner

*Primary Examiner*—Thanh X. Luu
*Assistant Examiner*—Brian Livedalen
(74) *Attorney, Agent, or Firm*—Oliff & Berridge PLC

(57) ABSTRACT

An electro-optical element is provided including a light-emitting element part and a light-receiving element part. An electro-optical element includes a light-emitting element part and a light-receiving element part having an optical surface and formed on the light-receiving element part. The electro-optical element emits light at least in a direction that the light-emitting element part and the light-receiving element part are formed in layers. In addition, an optical member is formed at least on the optical surface.

19 Claims, 12 Drawing Sheets design wavelength λ : 850 nm

ELECTRO-OPTICAL ELEMENT AND METHOD FOR MANUFACTURING THEREOF, OPTICAL MODULE AND METHOD FOR DRIVING THEREOF

BACKGROUND OF THE INVENTION

1. Field of Invention

The present invention relates to an electro-optical element and a method for manufacturing an electro-optical element, an optical module and a method to drive an optical module.

2. Description of Related Art

A related art light-emitting element, for example, a surface emitting semiconductor laser is disclosed in Japanese Unexamined Patent Publication Application No. 10-135568. Generally, if a light-emitting element is used for optical communication, optical arithmetic or a light source for various kinds of sensors, an optical characteristic of an emitted light, for example a radiation angle or a wavelength of light, requires control.

In the above related art light-emitting element, a light-detecting part is stacked on the light-emitting element. This light-detecting part receives a part of the light emitted from the light-emitting element, thereby detecting its light volume. Therefore, a diameter of the light-detecting part is made smaller than that of a light-emitting region of the light-emitting element so that part of the light emitted from the light-emitting element can be introduced into the light-detecting part.

In the above related art light-emitting element, the light-detecting part can be used as a normal light-receiving element, instead of or in addition to, its usage to monitor the power of light generated in the light-emitting element. In this case, as mentioned above, the diameter of the light-detecting part is generally made smaller than that of the light-emitting region of the light-emitting element part. However, this results in the light receiving area of the light-detecting part being too small thereby causing insufficient sensitivity.

SUMMARY OF THE INVENTION

An exemplary aspect of the invention provides an electro-optical element including a light-emitting element part and a light-receiving element part, and a method for manufacturing an electro-optical element.

Also, an exemplary aspect of the invention provides an optical module including an electro-optical element of an exemplary aspect of the invention and a method to drive the electro-optical element and an optical transmitting device including the electro-optical element.

Electro-Optical Element

An electro-optical element of an exemplary aspect of the invention includes a light-emitting element part, a light-receiving element part that includes an optical surface and is provided on the light-emitting element part, and an optical member provided at least on the optical surface. The electro-optical element emits light at least in a direction that the light-emitting element part and the light-receiving element part are formed in layers.

Here, the "optical member" refers to a member having a function of changing an optical characteristic or traveling direction of light. As for the "optical characteristic", for example, a wavelength, a deflection, a radiation angle or the like are exemplified. An optical member can be, for example, a lens or a deflection element.

Also, the "optical surface" refers to a surface that light passes through. The "optical surface" may be an exiting surface of light traveling from the electro-optical element of an exemplary aspect of the invention to an outside or an incident surface of the light traveling from the outside to the electro-optical element of an exemplary aspect of the invention. The "outside" refers to a region excluding the electro-optical element of the invention.

According to the electro-optical element of an exemplary aspect of the invention, the electro-optical element including the optical member whose placement position, shape, and size are properly controlled can be achieved.

Applications of the above-mentioned electro-optical element may include following exemplary aspects (1) through (8).

(1) An upper surface of the light-receiving element part may include the optical surface.

(2) A cross-sectional surface cut by a plane being parallel to the optical surface of the optical member may be at least one of a circle and an oval.

In this case, the optical surface is at least one of the circle and the oval and a longest diameter of the cross-sectional surface of the optical member may be larger than the longest diameter of the cross-sectional surface of the optical surface. Here, if the optical surface is the circle, the longest diameter is a diameter. If the optical surface is the oval, the longest diameter is a long axis. This is applied to the optical member in same manner.

(3) The optical member may be formed by curing a liquid member by applying an energy.

(4) The light-receiving element part may include a function of converting a part of the light emitted from the light-emitting element part to a current.

(5) The light-receiving element part may include a function of converting a part of the light emitted from the light-emitting element part to a current.

In this case, an optical thickness d of the light-receiving element part may be represented by the following formula (1).

$$d = m\lambda/2 \text{ (m is a natural number greater than or equal to one)} \quad \text{Formula (1)}$$

where a design wavelength of the light-emitting element part is $\lambda$.

Here, the "design wavelength" refers to a wavelength of the light whose intensity is the maximum among the light generated in the light-emitting element part. Also, the "optical thickness" refers to the value that is calculated by multiplying an actual film thickness of the layer by a refractive index.

(6) The light-emitting element part may include a first mirror, an active layer provided on the first mirror, and a second mirror provided on the active layer. The light-receiving element part may include a first contact layer, a light absorption layer provided on the first contact layer, and a second contact layer provided on the light absorption layer.

(7) The light-emitting element part may function as a surface emitting semiconductor laser.

(8) The optical member may function as a lens.

Method to Manufacture an Electro-Optical Element

An exemplary method to manufacture an electro-optical element of an exemplary aspect of the invention includes forming a stacked body made up of a light-emitting element part and a light-receiving element part including an optical surface; forming an optical member precursor by ejecting a liquid drop to the optical surface; and forming an optical member by curing the optical member precursor.

According to a method to manufacture an electro-optical element of an exemplary aspect of the invention, the electro-optical element including the optical member whose placement position, shape, and size are properly controlled can be achieved.

The liquid drop may be made of a liquid member that is cured by applying energy.

Optical Module and an Optical Transmitting Device

An optical module of an exemplary aspect of the invention includes a first electro-optical element, a second electro-optical element and an optical waveguide. The first and second electro-optical elements are the electro-optical element described above. A light emitted from the optical surface of the first element transmits through the optical waveguide, thereby being incident on the optical surface of the second element. A light emitted from the optical surface of the second element transmits through the optical waveguide, thereby being incident on the optical surface of the first element.

An optical transmitting device according to an aspect of the invention includes the above-mentioned optical module.

Method to Drive an Optical Module

A method to drive an optical module of an exemplary aspect of the invention is a method to drive the optical module including a first electro-optical element, a second electro-optical element, and an optical waveguide. Here, the first electro-optical element and second electro-optical element are the above-mentioned electro-optical element. The method includes controlling the first and the second electro-optical element such that if the first electro-optical element is in a light-emitting state, the second electro-optical element is in a light-receiving state, and if the first electro-optical element is in the light-receiving state, the second electro-optical element is in the light-emitting state.

In an exemplary aspect of the present invention, the "light-receiving state" refers to a state where a light-receiving function is capable of being demonstrated. This does not concern whether the electro-optical element of an exemplary aspect of the invention actually receives the light or not.

DETAILED DESCRIPTION OF EXEMPLARY EMBODIMENTS

Exemplary embodiments of the invention will now be described with reference to the accompanying drawings.

First Exemplary Embodiment

1. Construction of an Electro-Optical Element

Figure 1:
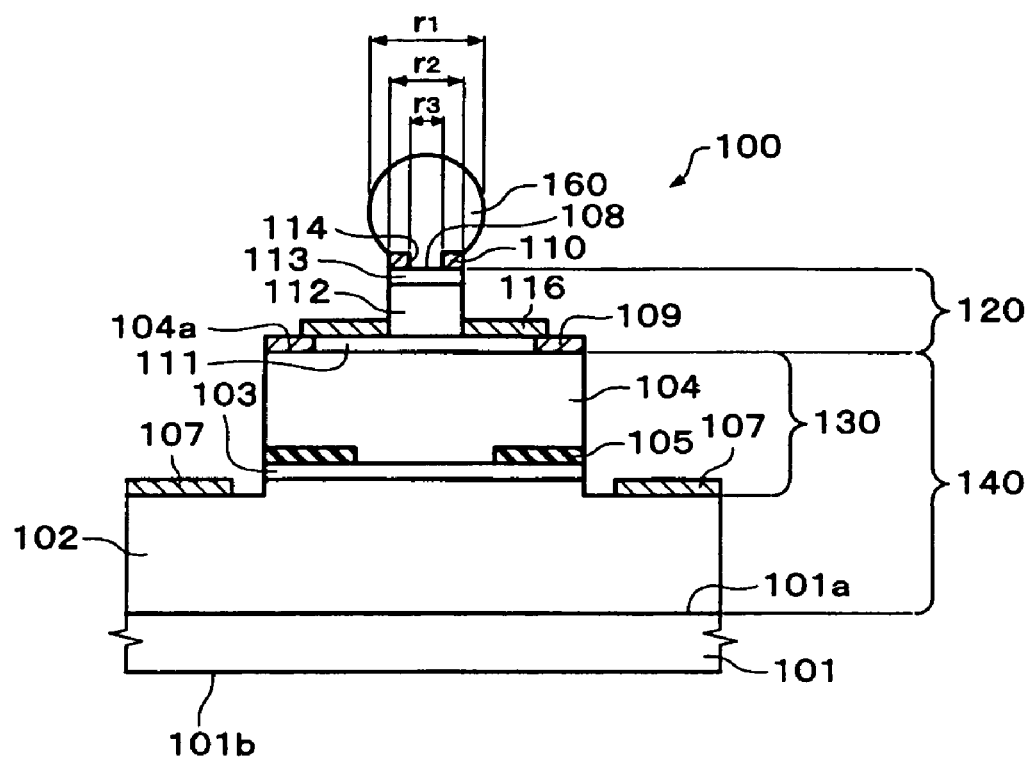
FIG. 1 is a schematic illustrating an electro-optical element of a first exemplary embodiment of the invention.
Figure 2:
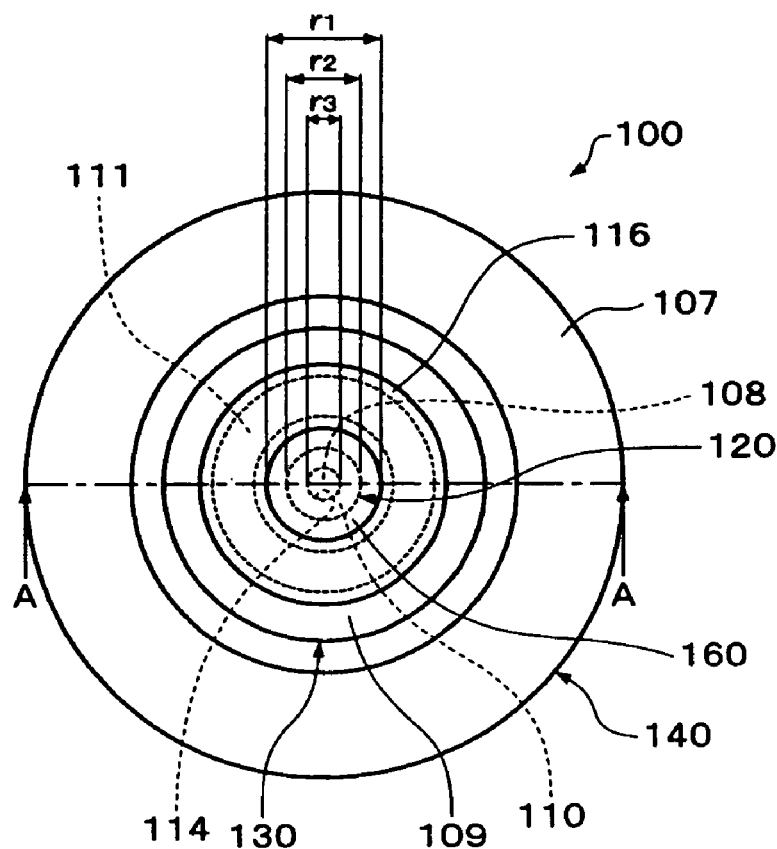
FIG. 2 is a schematic illustrating the electro-optical element shown in FIG. 1.

FIG. 1 is a schematic illustrating an electro-optical element 100 according to a first exemplary embodiment of the invention. FIG. 2 is a schematic illustrating the electro-optical element 100 in FIG. 1.

The electro-optical element 100 in the exemplary embodiment, as shown in FIG. 1, includes a light-emitting element part 140 and a light-receiving element part 120. In the exemplary embodiment, a case where the light-emitting element part 140 functions as a surface emitting semiconductor laser and the light-receiving element part 120 functions as a light-detecting part is described.

In this electro-optical element 100, a laser light can be emitted from an optical surface 108 in a direction that the light-emitting element part 140 and the light-receiving element part 120 are formed in layers. An optical member 160 is disposed at least on the optical surface 108. The light-emitting element part 140, the light-receiving element part 120, and other elements will be described below.

Light Emitting Element Part

The light-emitting element part 140 is formed on a semiconductor substrate 101 (in this exemplary embodiment, a n-type GaAs (Gallium Arsenide) substrate). The light-emitting element part 140 constructs a vertical resonator (hereafter, resonator).

Also, the light-emitting element part 140 may include a semiconductor stack body 130 of columnar like shape (hereafter, columnar part).

The light-emitting element part 140 is constructed by forming, for example, a distributed reflection type multilayer film mirror 102 (hereafter, a first mirror) including 40 pairs of a n-type $Al_{0.9}Ga_{0.1}As$ (aluminum-gallium-arsenide) layer and a n-type $Al_{0.15}Ga_{0.85}As$ layer alternately deposited one above another, an active layer 103 including a $Al_{0.3}Ga_{0.7}As$ barrier layer and a GaAs well layer that includes a quantum well structure constructing three layers, and a distributed reflection type multilayer film mirror 104 (hereafter, a second mirror) including 29.5 pairs of a p-type $Al_{0.9}Ga_{0.1}As$ layer and a p-type $Al_{0.15}Ga_{0.85}As$ layer alternately deposited one above another in this order. A composition of each layer and the number of layers in the first mirror 102, the active layer 103, and the second mirror 104 are not limited to those described above.

The second mirror 104 is p-type doped by carbon (C), for example. The first mirror 102 is n-type doped by silicon (Si), for example. Therefore, a pin diode is formed by the p-type second mirror 104, the active layer in which no impurities is doped, and n-type first mirror 102.

In the light-emitting element part 140, the columnar part 130 is formed on the first mirror 102 by etching, in a circular shape viewed from an upper surface 104a of the second mirror 104. The columnar part 130 includes the second mirror 104, the active layer 103 and a part of the first mirror 102. In the exemplary embodiment, while a plan shape of the columnar part 130 is described as the circular shape, any shape can be acceptable for the shape.

A current constriction layer 105 made of aluminum oxide is formed in a region that is closer to the active layer 103 among the layers constructing the second mirror 104. The current constriction layer 105 is formed in substantially a ring. Accordingly, the current constriction layer 105 shows a concentric circle as in a cross-sectional surface cut by a plane being parallel to a surface 101a of the semiconductor substrate 101 in FIG. 1.

Also, a first electrode 107 and a second electrode 109 are formed in the light-emitting element part 140.

The first electrode 107 and the second electrode 109 are used to drive the light-emitting element part 140. The second electrode 109 is formed on an upper surface 140a of the light-emitting element part 140. Specifically, as shown in FIG. 2, the first electrode 107 and the second electrode 109 have substantially a plan shape of a ring. The first electrode 107 is formed so as to surround the columnar part 130 and the second electrode 109 is formed so as to surround the light-receiving element part 120. The columnar part 130 is formed inside the first electrode 107 and the light-receiving element part 120 is formed inside the second electrode 109.

In the exemplary embodiment, while the case where the first electrode 107 is formed on the first mirror 102 has been described, the first electrode 107 may be formed on a backside 101b of the semiconductor substrate 101.

The above may be applied to a second and a third exemplary embodiment described later in same manner.

The first electrode 107 is made up of stacked layers of gold (Au) and an alloy of Au and germanium (Ge), for example. The second electrode 109 is made up of stacked layers of platinum (Pt), titanium (Ti), and Au. A current is injected in the active layer 103 by the first electrode 107 and the second electrode 109. A material forming the first electrode 107 and the second electrode 109 is not limited as described above. For example, an alloy of Au and zinc (Zn) are applicable.

Light Receiving Element Part

The light-receiving element part 120 is formed on the light-emitting element part 140 and includes the optical surface 108. As for the electro-optical element 100 in the exemplary embodiment, an upper surface of the light-receiving element part 120 includes the optical surface 108. At least upper part of the light-receiving element part 120 is a columnar like shape.

Also, the light-receiving element part 120 includes a first contact layer 111, a light absorption layer 112, and a second contact layer 113. The first contact layer 111 is formed on the second mirror 104 of the light-emitting element part 140. The light absorption layer 112 is formed on the first contact layer 111. The second contact layer 113 is formed on the light absorption layer 112. In addition, as for the light-receiving element part 120 in the exemplary embodiment, a case where a plan shape of the first contact layer 111 is larger than that of the light absorption layer 112 and that of the second contact layer 113 is shown (refer to FIG. 1 and FIG. 2). Also, the first contact layer 111 contacts the second electrode 109 and a third electrode 116. A part of the third electrode 116 is formed on the second electrode 109. Therefore, a side surface of the first contact layer 111 contacts the second electrode 119 and an upper surface of the second electrode 119 contacts the third electrode 116.

The first contact layer 111 can be formed by the n-type GaAs layer, for example. The light absorption layer 112 can be formed by the GaAs layer in which an impurity is not introduced, for example. The second contact layer 113 can be formed by the p-type GaAs layer. Specifically, the first contact layer 111 is p-type doped by C, for example. The second contact layer 113 is n-type doped by Si, for example. Therefore, the pin diode is formed by the n-type first contact layer 111, the light absorption layer 112 in which no impurities are doped, and p-type the second contact layer 113.

The third electrode 116 and a fourth electrode 110 are formed in the light-receiving element part 120. The third electrode 116 and the fourth electrode 110 are used to drive the light-receiving element part 120. Also, as for the electro-optical element 100 in the exemplary embodiment, the same material as that of the first electrode 107 can form the third electrode 116. The same material as that of the second electrode 109 can form the fourth electrode 110.

The fourth electrode 110 is formed on an upper surface of the light-receiving element part 120 (on the second contact layer 113). An opening 114 is provided in the fourth electrode 110. A bottom of the opening 114 is the optical surface 108. Therefore, changing a plan shape and size of the opening 114 can set a shape and size of the optical surface 108. In the exemplary embodiment, as shown in FIG. 1, the optical surface 108 is shown in substantially a circle shape as an example.

Optical Member

As for the electro-optical element 100 in the exemplary embodiment, the optical member 160 is disposed at least on the optical surface 108. Specifically, as shown in FIG. 1, the optical member 160 is disposed on the upper surface of the light-receiving element part 120. In the exemplary embodiment, a case where the electro-optical element 160 functions as a lens will be described. In this case, the light generated in the light-emitting element part 140 emits from the optical surface 108 and is condensed by the optical member 160 so as to emit to the outside.

The optical member 160 is formed by curing a liquid material (for example, a precursor of an ultraviolet curable resin or a thermosetting resin) that is capable of curing by an energy, for example, such as heat or light or the like. Examples of the ultraviolet curable resin include an acrylic-type ultraviolet curable resin and epoxy-type resin. Also, for the thermosetting resin, a thermosetting polyimide-type resin or the like are exemplified.

The precursor of the ultraviolet curable resin is cured by an irradiation of ultraviolet light in a short time. Thus, this makes it possible to cure without passing through a process, such as heating in which the light-emitting element and light-receiving element are easily damaged. Consequently, forming the optical member 160 by employing the precursor of the ultraviolet curable resin, any influence on the element can be lessened.

Specifically, the optical member 160 is disposed as follows (refer to FIG. 9 and FIG. 10): A liquid drop 160a made of the liquid material is ejected at least to the optical surface 108 (in the exemplary embodiment, on the top of the light-receiving element part 120) so as to form a precursor of the optical member 160b. Then, the precursor of the optical member 160b is cured. A method to form the optical member 160 will be described later.

Also, the optical member 160 is a cutting sphere like. Since the optical member 160 is a cutting sphere like, the optical member 160 can be used as a lens or a deflection element. For example, by forming the upper surface of the light-receiving element part 120 a circle, in substantially a three dimensional shape of the optical member 160 can be formed the cutting sphere like. Alternatively, shaping the upper surface of the light-receiving element part 120 an oval, a three dimensional shape of the optical member 160 can be formed the cutting oval body like.

Here, the "cutting sphere" means a shape obtained by cutting a sphere with a plane. This sphere includes not only a perfect sphere but also a shape similar to the sphere.

As for the electro-optical element 100 in this exemplary embodiment, a cross-sectional surface that is obtained by cutting the optical member 160 with a plane being parallel to the optical surface 108 is a circle and the optical surface 108 is shaped a circle. In this case, as shown in FIG. 1 and FIG. 2, it enables the longest diameter r1 (a diameter) of the cross-sectional surface that is obtained by cutting the optical member 160 with a plane parallel to the optical surface 108 to be larger than the longest diameter (a diameter) r2 of the upper surface of the light-receiving element part 120 and the longest diameter (a diameter) r3 of the optical surface 108, because at least the upper part of the light-receiving element part 120 has a columnar like shape.

Whole Construction

As for the electro-optical element 100 in this exemplary embodiment, a npnp construction is formed, as a whole, by the n-type first mirror 102 and the p-type second mirror of the light-emitting element part 140, and the n-type first contact layer 111 and the p-type second contact layer 113 of the light-receiving element part 120. By interchanging the p-type and n-type in the each layer described above, a pnpn construction can be formed as a whole. Alternatively, although not shown in the FIGS., by interchanging p-type and n-type of the each layer in either the light-emitting element part 140 or the light-receiving element part 120, the light-emitting element part 140 and the light-receiving element part 120 can be formed as the npn or pnp construction as a whole. The above may be applied to the second and third exemplary embodiment described below.

The light-receiving element part 120 has a function of monitoring an output of light generated in the light-emitting element part 140.

Specifically, the light-receiving element part 120 converts the light generated in the light-emitting element part 140 to a current. The output of the light generated in the light-emitting element part 140 is detected by a value of the current.

Specifically, in the light-receiving element part 120, a part of the light generated in the light-transmitting element part 140 is absorbed in the light absorption layer 112. The absorbed light causes a light excitation in the light absorption layer 112, thereby producing an electron and a positive hole. By an electric field applied from outside of the element, the electron is moved to the third electrode 116, and the positive hole is moved to the fourth electrode respectively. As a result, a current arises in a direction from the first contact layer 111 to the second contact layer 113.

Also, principally a bias voltage applied to the light-emitting element 140 determines the light output of the light-emitting element part 140. Especially, if the light-emitting element 140 is the surface emitting semiconductor laser, the light output of the light-emitting element part 140 fluctuates widely depending on surrounding temperature of the light-emitting element part 140 or a lifespan of the light-emitting element part 140. Therefore, in the light-emitting element part 140, it is required to maintain the light output at predetermined values as follows: monitoring the light output of the light-emitting element part 140, a voltage applying to the light-emitting element part 140 is controlled based on a value of the current produced in the light-receiving element part 120 so as to adjust a value of the current flowing in the light-emitting element part 140. As a result, the light output of the light-emitting element part 140 is maintained. Control, where the light output of the light-emitting element part 140 is fed back to the voltage value applying to the light-emitting element part 140 can be carried out by using an outer electric circuit (a drive circuit, not shown).

In this exemplary embodiment, while a case where the electro-optical element 100 is the surface emitting semiconductor laser has been described, any electro-optical element, other than the surface emitting semiconductor laser, is applicable.

As for the electro-optical element that is applicable for the invention, for example, a semiconductor light emitting diode or the like are exemplified. The above will be applied to the electro-optical element according to the second to fourth exemplary embodiment of the invention described later in the same manner.

2. Operation of the Electro-Optical Element

General operation of the electro-optical element 100 in this embodiment will be described below. A driving method for the surface emitting semiconductor laser described below is an example. Various modifications can be made within the scope of the gist of the invention.

A forward voltage is applied to the pin diode by the first electrode 107 and the second electrode 109. A recombination of electron and positive hole occurs in the active layer 103 of the light-emitting element part 140, thereby generating light due to the recombination. Then, an induced emission occurs when the light travels forward and backward from the second mirror 104 to the first mirror 102, thereby amplifying an intensity of the light. If an optical gain exceeds an optical loss, a laser oscillates such that laser light emits from the upper surface 104a of the second mirror 104 and is incident on the first contact layer 111 of the light-receiving element part 120.

Next, in the light-receiving element part 120, the light that has been incident on the first contact layer 111 is incident on the light absorption layer 112. As the result is that a part of the incident light is absorbed in the light absorption layer 112, the light excitation occurs in the light absorption layer 112, thereby producing the electron and positive hole. By the electric field applied from the outside of the element, the electron is moved to the third electrode 116, and the hole is moved to the fourth electrode 110.

As a result, a current (a light current) arises in a direction from the first contact layer 111 to the second contact layer 113 in the light-receiving element part 120. The light output of the light-emitting element part 140 can be detected by measuring the value of the current. Also, the light that has passed through the light-receiving element part 120 is emitted from the optical member 160, in which a radiation angle of the light is reduced.

3. Method to Manufacture an Exemplary Embodiment of an Electro-Optical Element

Next, an example of an exemplary method to manufacture the electro-optical element 100 according to the first exemplary embodiment of the invention will be described with reference to FIGS. 3 through 10. FIGS. 3 through 10 are schematics illustrating one manufacturing process of the electro-optical element in FIG. 1. Each of the schematics is corresponding to a sectional view in FIG. 1.

Figure 3:
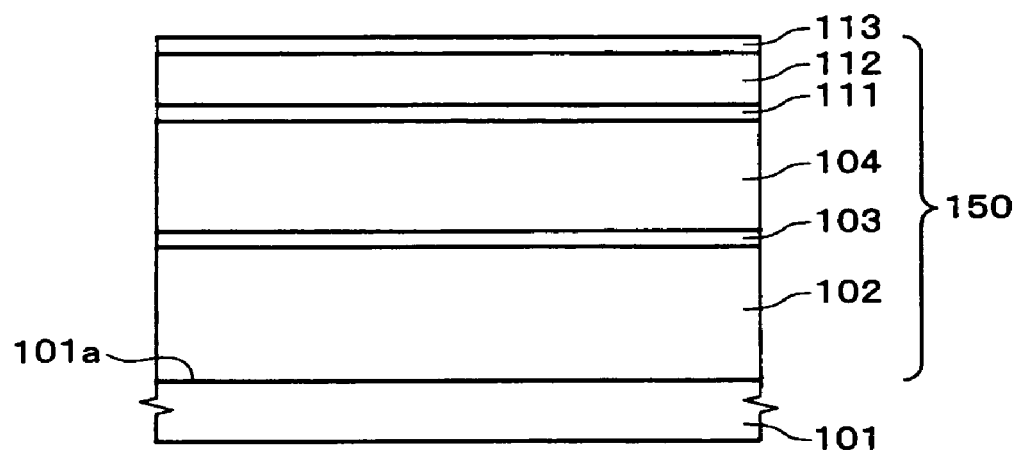
FIG. 3 is a schematic illustrating a manufacturing process of the electro-optical element shown in FIG. 1.

(1) First, a semiconductor multilayer film 150 is grown epitaxially on a surface 101a of the semiconductor substrate 101 including the n-type GaAs by changing and controlling its composition as shown in FIG. 3. Here, the semiconductor multilayer film 150 is formed of the following: the first mirror 102 including 40 pairs of a n-type $Al_{0.9}Ga_{0.1}As$ layer and a n-type $Al_{0.15}Ga_{0.85}As$ layer alternately deposited; the active layer 103 including a $Al_{0.3}Ga_{0.7}As$ barrier layer and a GaAs well layer that includes a quantum well structure constructing three layers; the second mirror 104 including 29.5 pairs of a p-type $Al_{0.9}Ga_{0.1}As$ layer and a p-type $Al_{0.15}Ga_{0.85}As$ layer alternately deposited; the first contact layer 112 including the n-type GaAs; and the second contact layer 113 including the p-type GaAs. Depositing those layers one after another, the semiconductor multilayer film 150 is formed (refer to FIG. 3).

In the growing of the second mirror 104, at least one layer that is closer to the active layer 103 is formed as an AlAs layer or AlGaAs layer containing 95% or more Al. This layer will be oxidized later so as to be the current constriction layer 105 (refer to FIG. 7). A carrier density may be high in the vicinity of a part of the second mirror 104 where the second mirror 104 contacts at least the second electrode 109, so as to easily take an ohmic contact-connection to the second electrode 109 in a later process in which the second electrode 109 is formed. In a similar way, that a carrier density may be high in the vicinity of a part of the first contact layer 111 where the first contact layer 111 contacts at least the third electrode layer 116 so as to easily take the ohmic contact-connection to the third electrode 116.

The temperature for the epitaxial growing is accordingly determined depending on a method to grow a row material, a type of the semiconductor substrate 101, a type and thickness of the semiconductor multilayer to be formed, and the carrier density. Generally, 450 degrees centigrade to 800 degrees centigrade is preferred. Also, a processing time for the epitaxial growing is accordingly determined as the same manner of the temperature. As for a method for the epitaxial growing, a metal-organic vapor phase epitaxy (MOVPE), a molecular beam epitaxy (MBE), or a liquid phase epitaxy (LPE) can be employed.

Figure 4:
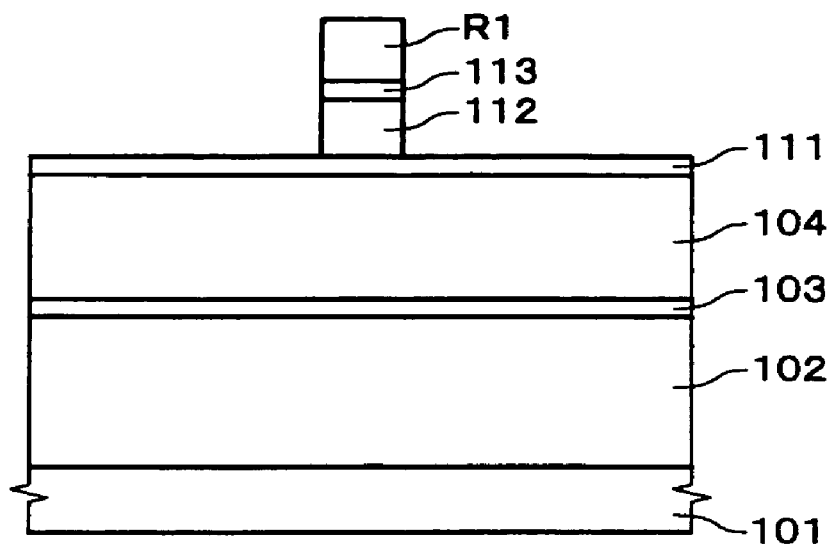
FIG. 4 is a schematic illustrating a manufacturing process of the electro-optical element shown in FIG. 1.

(2) Next, the second contact layer 113 and the light absorption layer 112 are patterned of a predetermined shape (refer to FIG. 4).

First, a photoresist (not shown) is applied on the semiconductor multilayer film 150. The photoresist is patterned by a photolithography method so as to form a resist layer R1 of a predetermined pattern.

Next, the second contact layer 113 and the light absorption layer 112 are etched by a dry-etching method, for example, using the resist layer R1 as a mask. Accordingly, the second contact layer 113 and the light absorption layer 112 having the same plane shape as that of the second contact layer 113 are formed. Then, the resist R1 is removed.

Figure 5:
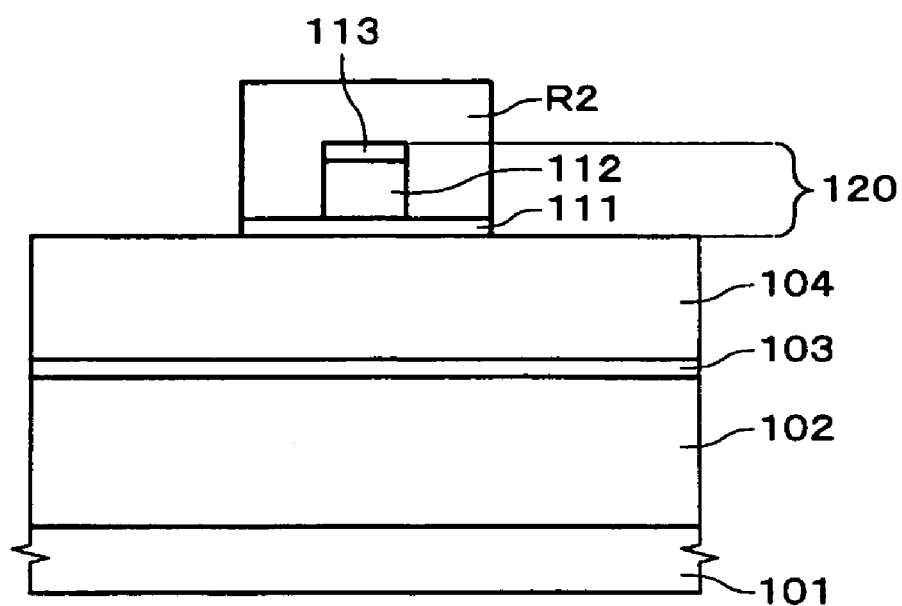
FIG. 5 is a schematic illustrating a manufacturing process of the electro-optical element shown in FIG. 1.

(3) Next, the first contact layer 111 is patterned of a predetermined shape (refer to FIG. 5). Specifically, at the first, the photoresist (not shown) is applied on the first contact layer 111. The photoresist is patterned by the photolithography method so as to form a resist layer R2 of a predetermined pattern (refer to FIG. 5).

Figure 7:
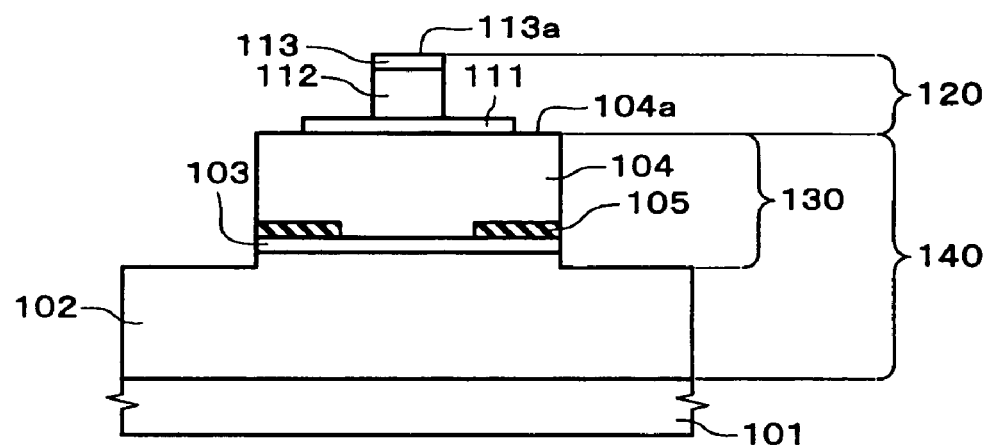
FIG. 7 is a schematic illustrating a manufacturing process of the electro-optical element shown in FIG. 1.
Figure 8:
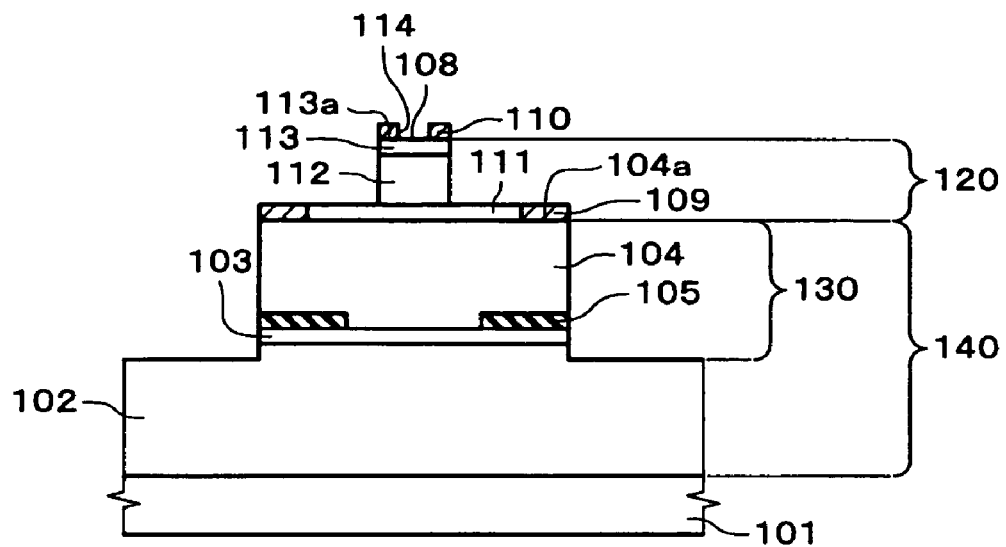
FIG. 8 is a schematic illustrating a manufacturing process of the electro-optical element shown in FIG. 1.

Next, the first contact layer 111 is etched by a dry-etching method, for example, using the resist layer R2 as a mask. Accordingly, the light-receiving element part 120 is formed as shown in FIG. 7. Then, the resist R2 is removed. The light-receiving element part 120 includes the second contact layer 113, the light absorption 112, and the first contact layer 111. A plane shape of the first contact layer 111 can be formed larger than that of the second contact layer 113 and the light absorption layer 112.

In above-mentioned processes, the first contact layer 111 is patterned after the patterning of the second contact layer 113 and the light absorption layer 112. Alternatively, the patterning of the second contact layer 113 and the light absorption layer 112 may be patterned after patterning of the first contact layer 111.

Figure 6:
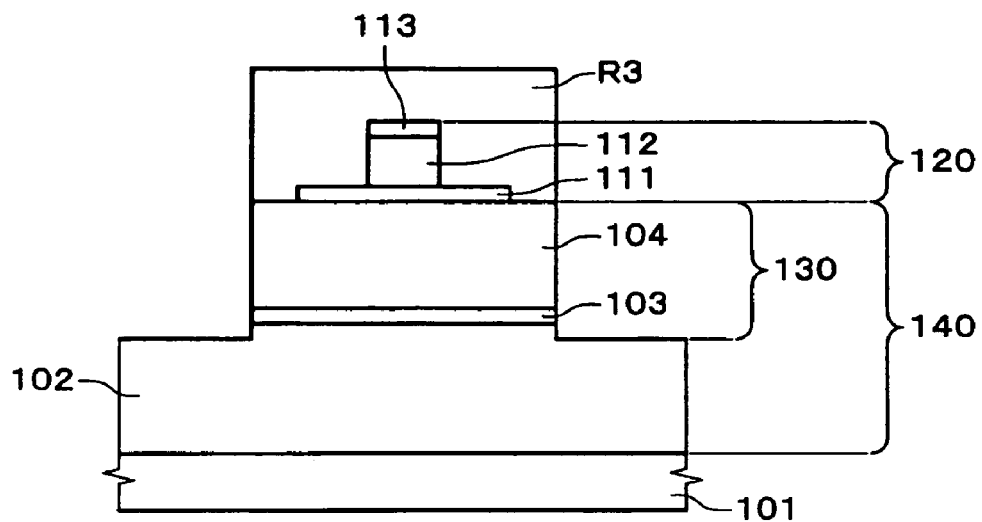
FIG. 6 is a schematic illustrating a manufacturing process of the electro-optical element shown in FIG. 1.

(4) Next, the light-emitting element part 140, including the columnar part 130, is formed by the patterning (refer to FIG. 6). Specifically, first, the photoresist (not shown) is applied on the second mirror 104. The photoresist is patterned by the photolithography method so as to form a resist layer R3 of a predetermined pattern (refer to FIG. 6).

Next, the second mirror 104, the active layer 103, and a part of the first mirror 102 are etched by the dry-etching method, for example, using the resist layer R3 as a mask, thereby forming the columnar part 130 as shown in FIG. 6. A resonator including the columnar part 130 (the light-emitting element part 140) is formed by processes as described above. Specifically, a stacked body made up of the light-emitting element part 140 and the light-receiving element part 120 is formed. Then, the resist layer R3 is removed.

As mentioned above, in this exemplary embodiment, the light-receiving element part 120 has been formed prior to the formation of the columnar part 130. Alternatively, the light-receiving element part 120 may be formed after the formation of the columnar part 130.

(5) Next, the semiconductor substrate 101 in which the columnar part 130 has been formed in processes described above is subjected to, for example, water vapor at approximately 400 degrees centigrade, so as to form the current constriction layer 105 by oxidizing the layer containing high composition Al in the second mirror 104 from its side (refer FIG. 7).

An oxidation rate depends on temperature of a furnace, a supply amount of water vapor, Al composition and a thickness of a layer to be oxidized (the layer containing high composition Al described above). In a surface light-emitting laser including the current constriction layer formed by the oxidization, a current flows through only a part where the current constriction layer has not been formed (a part where the oxidization has not been done) at a time of driving. Therefore, controlling an area where the current constriction layer 105 is formed in its forming process with the oxidation, a current density can be controlled.

Also, a diameter of the current constriction layer 105 may be adjusted so that a large portion of the light emitted from the light-emitting element part 140 is incident on the first contact layer 111.

(6) Next, the second electrode 109 is formed on the upper surface 104a of the second mirror 104. Then, the fourth electrode 110 is formed on the top of the light-receiving element part 120 (on an upper surface 113a of the second contact layer 113) (refer to FIG. 8).

First, prior to forming the second electrode 109 and the fourth electrode 110, the upper surface 104a of the second mirror 104 and the upper surface 113a of the second contact layer 113 are cleaned by a plasma treatment method or the like, if necessary. This enables formation of an element having more stable characteristic.

Next, a deposited multiple layer of, for example, Pt, Ti, and Au (not shown) is formed, for example, by a vacuum deposition method. Then, the deposited multiple layer excluding a predetermined position is removed by a liftoff method so as to form the second electrode 109 and the fourth electrode 110. In this process, a part, to which the deposited multiple layers described above is not provided, is formed on the upper surface 113a of the second contact layer 113. This part forms the opening 114 and its bottom is the optical surface 108. In above-mentioned process, the dry-etching method also can be used instead of the liftoff method. Additionally, while the second electrode 109 and the fourth electrode 110 are patterned together in above-mentioned process, the second electrode 109 and the fourth electrode 110 can be patterned individually.

Figure 9:
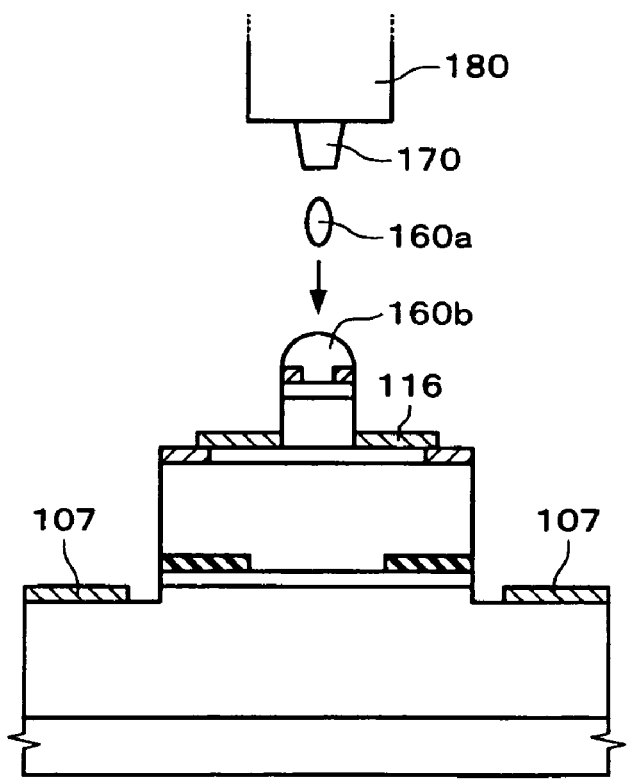
FIG. 9 is a schematic illustrating a manufacturing process of the electro-optical element shown in FIG. 1.

(7) Next, in the same manner, patterning the deposited multiple layer made up of, for example, Au and an allay of Au and Ge, the first electrode 107 is formed on the first mirror 102 of the light-emitting element part 140, and the third electrode 116 is formed on the first contact layer 111 of the light-receiving element part 120 (refer to FIG. 9).

Then, an annealing is done. Temperature of the annealing depends on an electrode material. As for the electrode material used in this exemplary embodiment, it is usually done approximately at 400 degrees centigrade. The first electrode 107 and the third electrode 116 are formed by processes described above (refer to FIG. 9). The first electrode 107 and the third electrode 116 can be formed by the patterning at together or individually.

Processes mentioned above achieve the electro-optical element 100 including the light-emitting element part 140 and the light-receiving element part 120.

Figure 10:
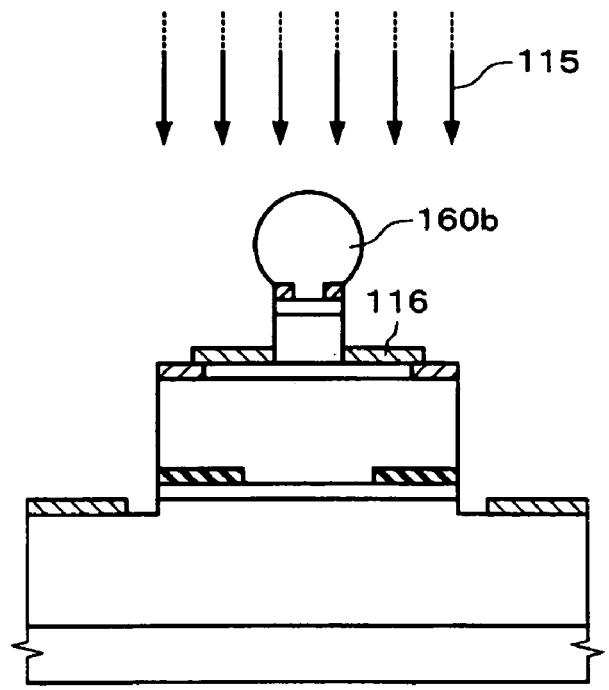
FIG. 10 is a schematic illustrating a manufacturing process of the electro-optical element shown in FIG. 1.

(8) Next, the optical member 160 is formed on the light-receiving element part 120 (refer to FIGS. 9 and 10). In this exemplary embodiment, a case where a part of the optical member 160 is formed on the optical surface 108, and another part of the optical member 160 is formed on the light-receiving element part 120 with the fourth electrode 110 (refer to FIG. 1) will be described.

First, a treatment to adjust a wet angle of the optical member 160 is carried out on the upper surface of the light-receiving element part 120 (on the surface of the second contact layer 113 and the optical surface 108), if necessary. This process makes it possible to achieve an optical member precursor 160b as a predetermined shape if the liquid material is introduced on the upper surface of the light-receiving element part 120 in a process described later, thereby achieving the optical member having a predetermined shape (refer to FIGS. 9 and 10).

Then, a liquid drop 160a of the liquid material is ejected toward the optical surface 108 by inkjet method for example. Examples of an inkjet ejection method include (1) a method that the size of bubbles in an ejection liquid (here, the liquid for optical member precursor) are changed by heat so as to generate pressure, thereby ejecting the liquid, and (2) a method that pressure generated by piezoelectric elements eject liquid. From a controllability of pressure point of view, a method described above in (2) is preferable.

An alignment between a nozzle position of an inkjet head and an ejecting position of the liquid is carried out by a related art image recognition technique that is used in an exposure process or an inspection process of a general manufacturing process of a semiconductor integrated circuit. For example, the alignment between a position of a nozzle 170 of an inkjet head 180 and a position of an optical surface 108 is carried out as shown in FIG. 9. After the alignment, the inkjet head 180 ejects the liquid drop 160a of the liquid material by controlling a voltage applied to the inkjet head 180. Accordingly, the optical member precursor 160b is formed on the upper surface of the light-receiving element part 120 as shown in FIG. 9.

In this case, as shown in FIG. 9, at the time when the liquid drop 160a ejected from the nozzle 170 lands on the upper surface of the light-receiving element part 120, the liquid material 160b is deformed by surface tension, thereby positioning the liquid material 160b at the center of the upper surface of the light-receiving element part 120. Accordingly, the position is automatically adjusted.

Also, in this case, the optical member precursor 160b (refer to FIG. 10) has a shape and size in accordance with a shape and size of the upper surface of the light-receiving element part 120, an ejecting amount of the liquid drop 160a, surface tension of the liquid drop 160a, and surface tension between the upper surface of the light-receiving element part 120 and the liquid drop 160a. Therefore, controlling these factors, a shape and size of the optical member 160 that is finally achieved (refer FIG. 1) can be controlled, thereby increasing a freedom of a lens design.

After completion of the processes described above, as shown in FIG. 10, the optical member precursor 160b is cured by an energy ray (for example, an ultraviolet ray) so as to form the optical member 160 on the upper surface of the light-receiving element part 120 (refer to FIG. 1). Here, the optimum wavelength and irradiation amount of the ultraviolet ray depends on a material of the optical member precursor 160b. For example, if a precursor of an acrylic-type ultraviolet curable resin is used to form the optical member precursor 160b, the curing is done by the ultraviolet ray irradiation with the condition that the wavelength is approximately 350 nm, intensity is 10 mw, and irradiation time is 5 minutes. The processes mentioned above achieve the electro-optical element 100 of the exemplary embodiment as shown in FIG. 1.

4. Beneficial Effects

The electro-optical element 100 of the exemplary embodiment includes beneficial effects as follows.

(A) First, by providing the optical member 160 at least on the optical surface 108, the light generated in the light-emitting element 140 can be emitted outside after adjusting its radiation angle. For example, by providing the optical member 160, the radiation angle of the light generated in the light-emitting element 140 can be reduced. Accordingly, if the light emitted from the electro-optical element 100 of the exemplary embodiment is introduced into an optical waveguide, such as an optical fiber or the like, this makes it easier to introduce the light to the optical waveguide.

(B) Second, the size and shape of the optical member 160 can be strictly controlled. As above-mentioned in the process (8), in order to form the optical member 160, the optical member precursor 160b is formed on the upper surface of the light-receiving element part 120 in the process to form the optical member 160 (refer to FIGS. 8 and 9). Here, as long as the liquid material making the optical member precursor 160b does not wet a side of the light-receiving element part 120, surface tension of the liquid material principally acts on the optical member precursor 160b. Therefore, the shape of the optical member precursor 160b can be controlled by controlling an amount of the liquid material (the liquid drop 160a) used to form the optical member 160. This makes it possible to form an optical member 160 whose shape is strictly controlled. As a result, the optical member 160 having a predetermined shape and size can be achieved.

(C) Third, a placement position of the optical member 160 can be strictly controlled. As above-mentioned, the optical member 160 is formed as follows. At first, ejecting the liquid drop 160a on the upper surface of the light-receiving element part 120, the optical member precursor 160b is formed. Then, the optical member precursor 160b is cured (refer to FIGS. 9 and 10). Generally, it is difficult to strictly control the position on which the ejected liquid lands. However, this method makes it possible to form the optical member 160 on the upper surface of the light-receiving element part 120 without positioning. Specifically, simply ejecting the liquid drop 160a on the upper surface of the light-receiving element part 120, the optical member precursor 160b can be formed without positioning. This enables the optical member 160, whose placement position is controlled, to form simply and at a high yield rate.

If the liquid drop 160b is ejected by the inkjet method, it can eject the liquid drop 160b to a more accurate position, thereby enabling the optical member 160, whose placement position is more controlled, to form simply and at a high yield rate. Also, ejecting the liquid drop 160a by the inkjet method, the ejecting amount of the liquid drop 160b can be controlled at a unit of a picoliter order, thereby enabling a precise structure to form accurately.

(D) Fourth, feeding back a result of a part of the output light of the light-emitting element part 140 monitored in the light-receiving element part 120 to the drive circuit, an output fluctuation due to temperature or the like can be corrected, thereby achieving a stable light output.

Second Exemplary Embodiment

1. Construction of the Electro-Optical Element.

Figure 11:
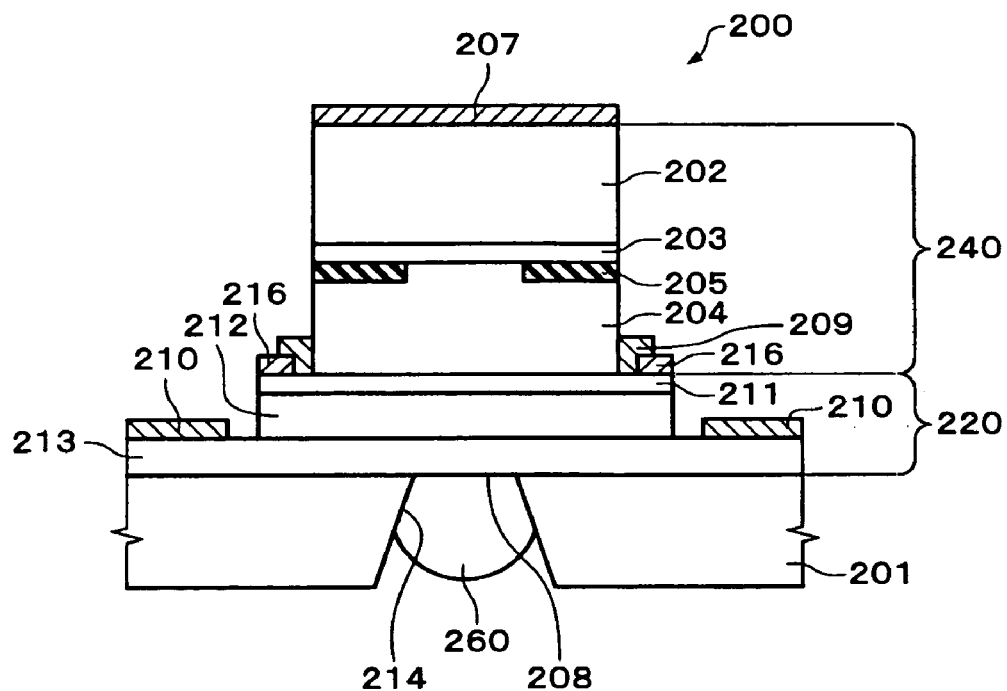
FIG. 11 is a schematic illustrating an electro-optical element of a second exemplary embodiment of the invention.

FIG. 11 is a schematic illustrating an electro-optical element 200 according to a second exemplary embodiment of the invention. In this exemplary embodiment, in the same manner as that of the first exemplary embodiment, a case where the light-emitting element part 240 functions as a surface emitting semiconductor laser and the light-receiving element part 220 functions as a light-detecting part is described.

The electro-optical element 200 of the exemplary embodiment differs from the electro-optical element 100 of the first exemplary embodiment in that the light-receiving element part 220 and the light-emitting element part 240 are deposited on a semiconductor substrate 201 in this order. As for the electro-optical element 200 of the exemplary embodiment, a similar construction element to a construction element described as "1XX" in the electro-optical element 100 of the first exemplary embodiment is described as "2XX". Therefore, the "2XX" represents the same construction element and is basically made of the same material as the "1XX" in the electro-optical element of the first exemplary embodiment, thereby omitting its detailed description.

The electro-optical element 200 of the exemplary embodiment includes a light-receiving element part 220 formed on the semiconductor substrate 201 and a light-emitting element part 240 formed on the light-receiving element part 220. This electro-optical element 200 can emit light in the direction that the light-emitting element part 240 and the light-receiving element part 220 are formed in layers.

The light-receiving element part 220 includes a second contact layer 213, a light absorption layer 212, and a first contact layer 211. The second contact layer 213 doped p-type, the light absorption layer 212, and the first contact layer 211 doped n-type are deposited on the semiconductor substrate 201 made of the p-type GaAs in this order. The second contact layer 213, the light absorption layer 212, and the first contact layer 211 can be formed by the same material as that of the second contact layer 113, the light absorption layer 112, and the first contact layer 111 in the first exemplary embodiment of the invention respectively.

The light-emitting element part 240 includes a second mirror 204, an active layer 203, and a first mirror 202. The second mirror 204 doped p-type, the active layer 203, and the first mirror layer 202 doped n-type are deposited on the light-receiving element part 220 in this order. The second mirror 204, the active layer 203, and the first mirror 202 can be formed from the same material as that of the mirror 104, the active layer 103, and the first mirror 102 of the first exemplary embodiment respectively. Also, a current constriction layer 205 is formed to the second mirror 204 the same as that of the second mirror 104 of the first exemplary embodiment.

Also, the electro-optical element 200 in the exemplary embodiment includes a first electrode 207, a second electrode 209, a third electrode 216, and a fourth electrode 210. The first electrode 207 and the second electrode 209 are used to drive the light-emitting element part 240. The third electrode 216 and the fourth electrode 210 are used to drive the light-receiving element part 220. The first electrode 207 is formed on the second mirror 207. The second electrode 209 and the third electrode 216 are formed on the first contact layer 211. The fourth electrode 210 is formed on the second contact layer 213. The second electrode 209, the third electrode 216, and the fourth electrode 210 have substantially the plan shape of a ring. The second electrode 209 is formed so as to surround the light-emitting element part 240 and the third electrode 216 and the fourth electrode 210 are formed so as to surround the light-receiving element part 220. Specifically, the light-emitting element part 240 is formed inside the second electrode 209 and the light-receiving element part 220 is formed inside the fourth electrode 210. Also, the second electrode 209 contacts a side of the second mirror 204. A part of the second electrode 209 is formed on the third electrode 216.

Also, in the electro-optical element 200 of the exemplary embodiment, if a face of the light-receiving element part 220 contacting a optical member 260 is defined as its upper surface, and a face of the light-receiving element part 20 contacting the light-emitting element part 240 is defined as its lower surface, an optical surface 208 is formed on the upper surface of the light-receiving element part 220. Specifically, an opening 214 that passes through the semiconductor substrate 201 is provided to the semiconductor substrate 201. A bottom of the opening 214 defines the optical surface 208. The optical member 206 is formed on the optical surface 208. The optical member 260 is buried in the opening 214.

As shown in FIG. 11, it enables the longest diameter of the cross-sectional surface, that is obtained by cutting the optical member 260 with a plane parallel to the optical surface 208 to be larger than the longest diameter of the optical surface 208.

2. Operation of the Electro-Optical Element

In the electro-optical element 200 of the exemplary embodiment, a stacking order of the light-receiving element part 240 and the light-emitting element part 220 is the opposite of that in the electro-optical element 100 of the first exemplary embodiment. However, a basic operation of the electro-optical element 200 of the exemplary embodiment is the same as that of the electro-optical element 100 of the first exemplary embodiment, thereby omitting its detailed description.

Consequently, in the electro-optical element 200 of the exemplary embodiment, a part of the light generated in the light-emitting element part 240 passes through the light-receiving element part 220 and emits from the optical surface 208. Then, it is emitted to the outside from the optical member 260 in which its radiation angle is reduced. The part of the light generated in the light-emitting element part 240 is absorbed in the optical absorption layer 212 so as to be converted to a current. As a result, the light output generated in the light-emitting element part 240 is detected.

3. Beneficial Effect

The electro-optical element 200 of the exemplary embodiment substantively includes the same effect as that of the electro-optical element 100 of the first exemplary embodiment. In addition, as for the electro-optical element 200 of the exemplary embodiment, since the optical member 260 is provided in the opening 214, the optical member 260 can be placed on the optical surface 108 stably.

Also, the optical member 260 is formed by curing the optical member precursor (not shown) that has been formed by dropping the liquid drop into the opening 214. Accordingly, adjusting a shape and a size of the opening 214, the optical member 260 can be made as a predetermined shape and size.

Third Exemplary Embodiment

1. Construction of the Electro-Optical Element

Figure 12:
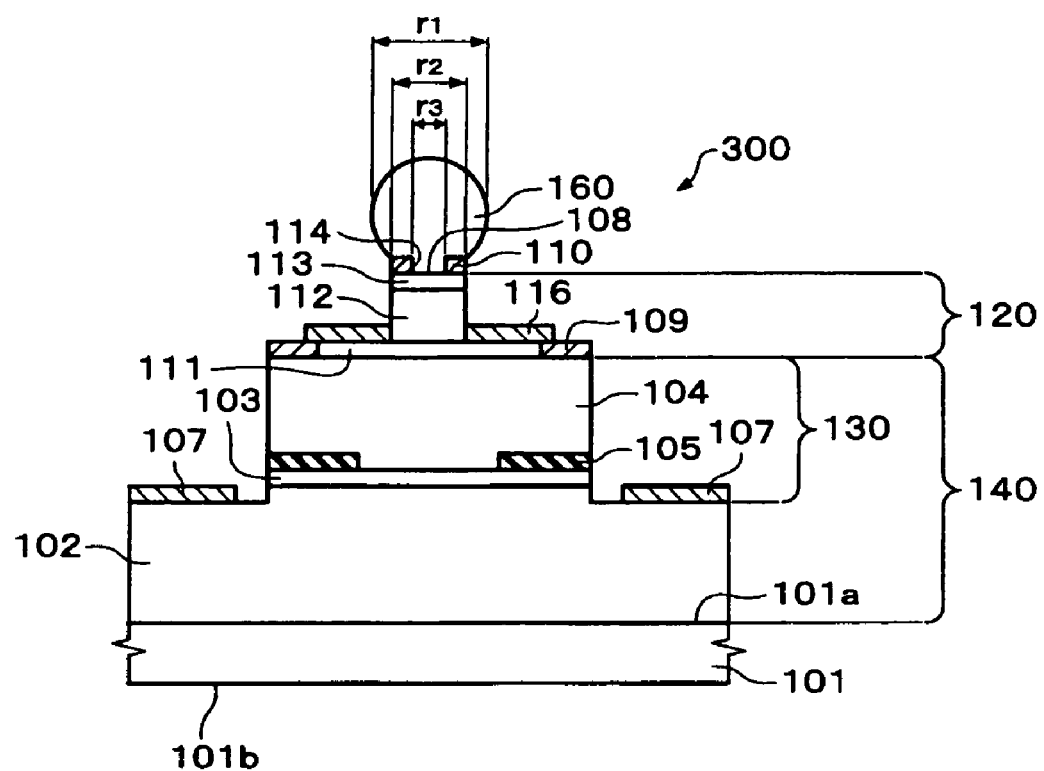
FIG. 12 is a schematic illustrating an electro-optical element of a third exemplary embodiment of the invention.
Figure 13:
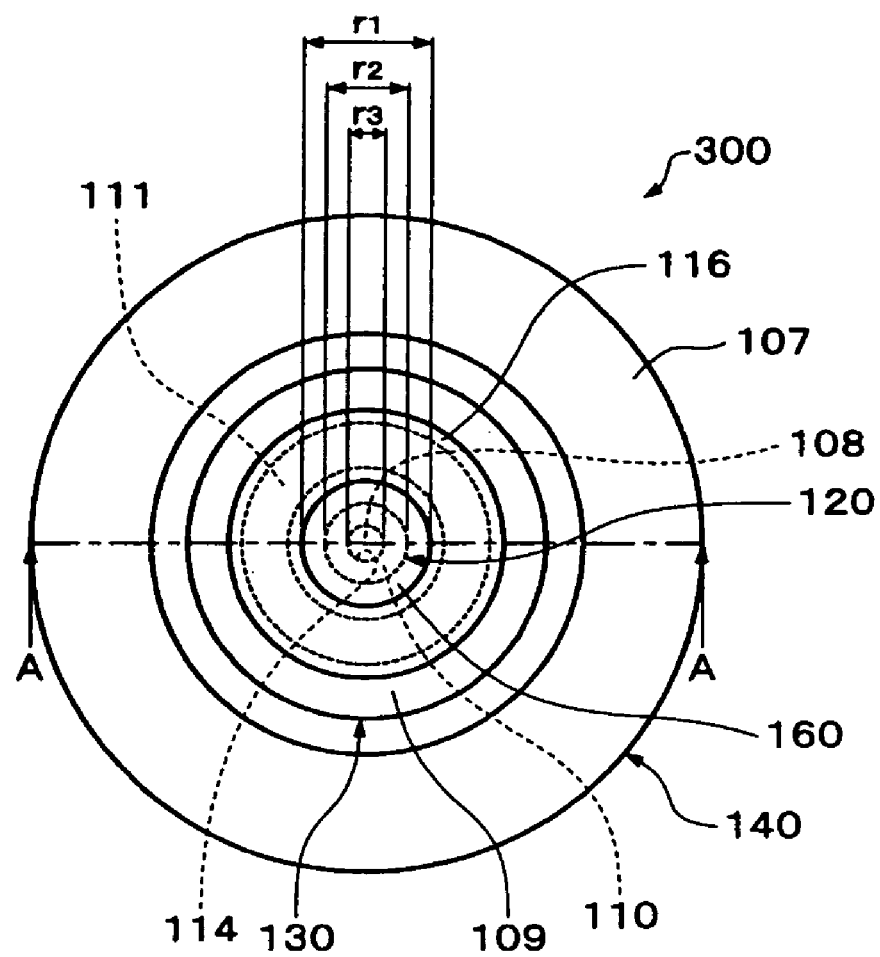
FIG. 13 is a schematic illustrating the electro-optical element shown in FIG. 12.

FIG. 12 is a schematic illustrating an electro-optical element 300 according to a third exemplary embodiment of the invention. Also, FIG. 13 is a schematic illustrating the electro-optical element 300 shown in FIG. 12. In this exemplary embodiment, in the same manner as that of the first exemplary embodiment and the second exemplary embodiment, a case where the light-emitting element part 240 functions as a surface emitting semiconductor laser and the light-receiving element part 220 functions as a light-detecting part is described.

The electro-optical element 300 according to the exemplary embodiment includes the same construction as that of the electro-optical element 100 of the first exemplary embodiment. Therefore, a construction element that is substantively the same as that of the electro-optical element 100 of the first exemplary embodiment is labeled as the same, thereby omitting its detailed description.

In the electro-optical element 300, the light-receiving element part 120 additionally has a function to absorb the light that is incident on the optical surface 108 after passing through the optical member 160 from the outside and convert it to a current. An optical thickness d is represented by the following formula (1), where $\lambda$ is a design wavelength of the light-emitting element part.

$$d = m\lambda/2 \qquad \text{Formula (1)}$$

(m is a natural number greater than or equal to one)

In the electro-optical element 300 of the exemplary embodiment, the optical thickness d of the light-receiving element part 120 is a summation of the each optical thickness of the first contact layer 111, the light absorption layer 112, and the second contact layer 113 as shown in FIG. 12. Since the optical thickness is a value that is calculated by multiplying an actual film thickness of the layer by a refractive index, for example, in case of the layer where the optical thickness is $\lambda/4$. the refractive index n is 2.0. and light wavelength is $\lambda$, the actual film thickness of the layer is equal to (the optical thickness)/(the refractive index n). Therefore, $(\lambda/4)/2.0 = 0.125\lambda$. In this exemplary embodiment, "thickness" refers to the actual thickness of the layer.

Setting the optical thickness d of the light-receiving element part 120 so as to satisfy the formula (1) described above, light of a specified wavelength can be absorbed efficiently in the light absorption layer 112 of the light-receiving element part 120.

Figure 14:
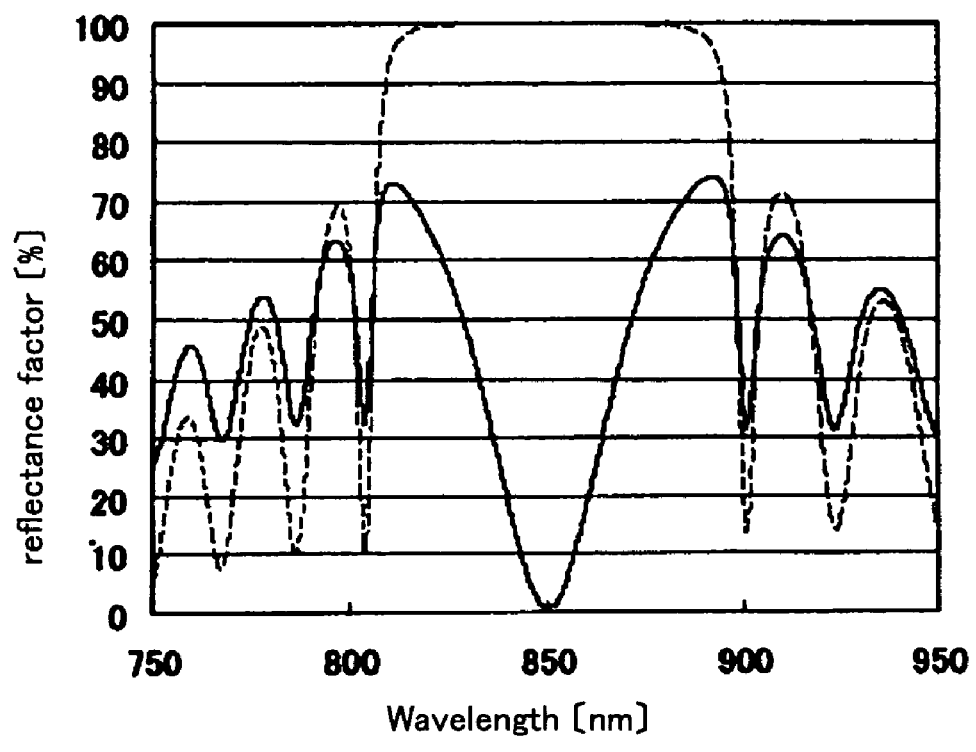
FIG. 14 is a schematic illustrating a first reflecting rate and a second reflecting rate of the electro-optical element shown in FIG. 12 with the condition that a design wavelength is 850 nm.

In the electro-optical element 300 of the exemplary embodiment, FIG. 14 shows a first rate (reflectance factor) of the light that is incident on the light-receiving element part 120 from the optical surface 108 reflected in the light-receiving element part 120 and a second rate (reflectance factor) of the light that is incident on the second mirror 104 from the active layer 103 reflected in the second mirror 104. The first rate, specifically, a reflectance factor of the light that is incident on the light-receiving element part 120 from the optical surface 108, is presented by a solid line and the second rate, specifically, a reflectance factor of the light that is incident on the second mirror 120 from the active layer 103 is presented by a broken line respectively in FIG. 14. Here, this case is based on the conditions as follows. The design wavelength $\lambda$ is 850 nm. The optical thickness d of the light-receiving element part 120 is $2\lambda$. The second mirror 104 of the light-emitting element part 140 is made up of 29.5 pairs of the p-type $Al_{0.9}Ga_{0.1}As$ layer having the optical thickness of $\lambda/4$ and the p-type $Al_{0.15}Ga_{0.85}As$ layer having the optical thickness of $\lambda/4$ alternately deposited one after another.

Referring to FIG. 14, if the light of the design wavelength $\lambda$ is incident on the second mirror 104 from the active layer 103, the reflectance factor of the light is nearly 100%. If the light of the design wavelength $\lambda$ is incident on the light-receiving element part 120 from the optical surface 108, the reflectance factor of the light is nearly 0%. Therefore, if the light of the design wavelength $\lambda$ is incident on the light-receiving element part 120 from the optical surface 108, most of the light is absorbed in the light-receiving element part 120.

From the above-mentioned results, according to the electro-optical element 300, setting the optical thickness d of the light-receiving element part 120 so as to satisfy the formula (1), the light can be absorbed efficiently in the light absorption layer 112 without changing of the construction of the light-emitting element part 140. Therefore, the light that is incident on the optical surface 108 from the outside can be introduced efficiently into the optical absorption layer 112 of the light-receiving element part 120.

Also, in the electro-optical element 200 of the second exemplary embodiment, the light-receiving element part may include the function that converts the light entered from the outside to the current as in the same manner as that of the electro-optical element 300 of the exemplary embodiment. In this case, setting the optical thickness of the light-receiving element part so as to satisfy the formula (1), the same effect as that of the electro-optical element 300 of the exemplary embodiment can be achieved.

2. Operation of the Electro-Optical Element.

In the electro-optical element 300 of the exemplary embodiment, the light-receiving element part 120 absorbs the light from the outside and converts it to current as described above. In this-case, the light from the outside is incident on the optical member 160. Then, the light is incident on the light-receiving element part 120 from the optical surface 108. The light is absorbed by the light absorption layer 112 and converted to the current. With the value of the current obtained there, an amount of the light that is entered from the outside can be detected. The light generated in the light-emitting element part 140 passes through the light-receiving element part 120. Then, the light is emitted from the optical member 160 in which its radiation angle is reduced. Operations other than those described above are the same as those of the electro-optical element 100 of the first exemplary embodiment, thereby omitting their detailed descriptions.

3. Beneficial Effect.

The electro-optical element 300 and the method to manufacture thereof according to the exemplary embodiment include the beneficial effect that is substantively the same as that of the electro-optical element 100 and that of the method to manufacture thereof according to the first exemplary embodiment.

Additionally, according to the electro-optical element 300 of the exemplary embodiment, the light-receiving element part 120 absorbs the light from the outside and converts it to current. In this case, since the optical member 160 is formed on the optical surface 108, a wide range of light can be incident on the optical surface 108.

The optical member 160 is formed as follows. At the first, ejecting the liquid drop on the upper surface of the light-receiving element part 120, the optical member precursor 160b is formed. Then, the optical member precursor 160b is cured.

Accordingly, as shown in FIGS. 12 and 13, this enables the longest diameter, specifically diameter r1, of the cross-section of the optical member 160, to be larger than the diameter r2 of the upper surface of the light-receiving element 120. Thus, this makes it possible to increase the diameter of the optical member 160, thereby enabling a wider range of light to be incident on the optical surface 108.

Also, in the electro-optical element 300 of the exemplary embodiment, the first electrode 107 and second electrode 109 formed in the light-emitting element part 140 have in plan a substantially ring shape (refer to FIG. 13). If the light-emitting element part 140 functions as the surface emitting semiconductor laser, since the first electrode 107 and second electrode 109 have a substantially ring shape in plan, current can flow uniformly in the light-emitting element part 140.

Each sectional view of the first electrode 107, the second electrode 109, the columnar part 130, and the light-receiving element part 120 is placed to be in a substantially concentric circle. Specifically, the columnar part 130 and the second electrode 109 are formed inside the first electrode 107 and the light-receiving element part 120 is formed inside the second electrode 109. Therefore, as shown in FIG. 12, the optical surface 108 formed on the upper surface of the light-receiving element part 120 is smaller than the cross-sectional surface of the light-emitting element part 140. As a result, this makes it difficult to introduce the light from the outside through the optical surface 108.

However, in the electro-optical element 300 of the exemplary embodiment, by providing the optical member 160 on the optical surface 108, the light from the outside can be introduced efficiently through the optical surface 108. Consequently, while the first electrode 107 and second electrode 109 have a substantially ring shape in plan, the light can be introduced efficiently through the optical surface 108.

Fourth Exemplary Embodiment

Figure 15:
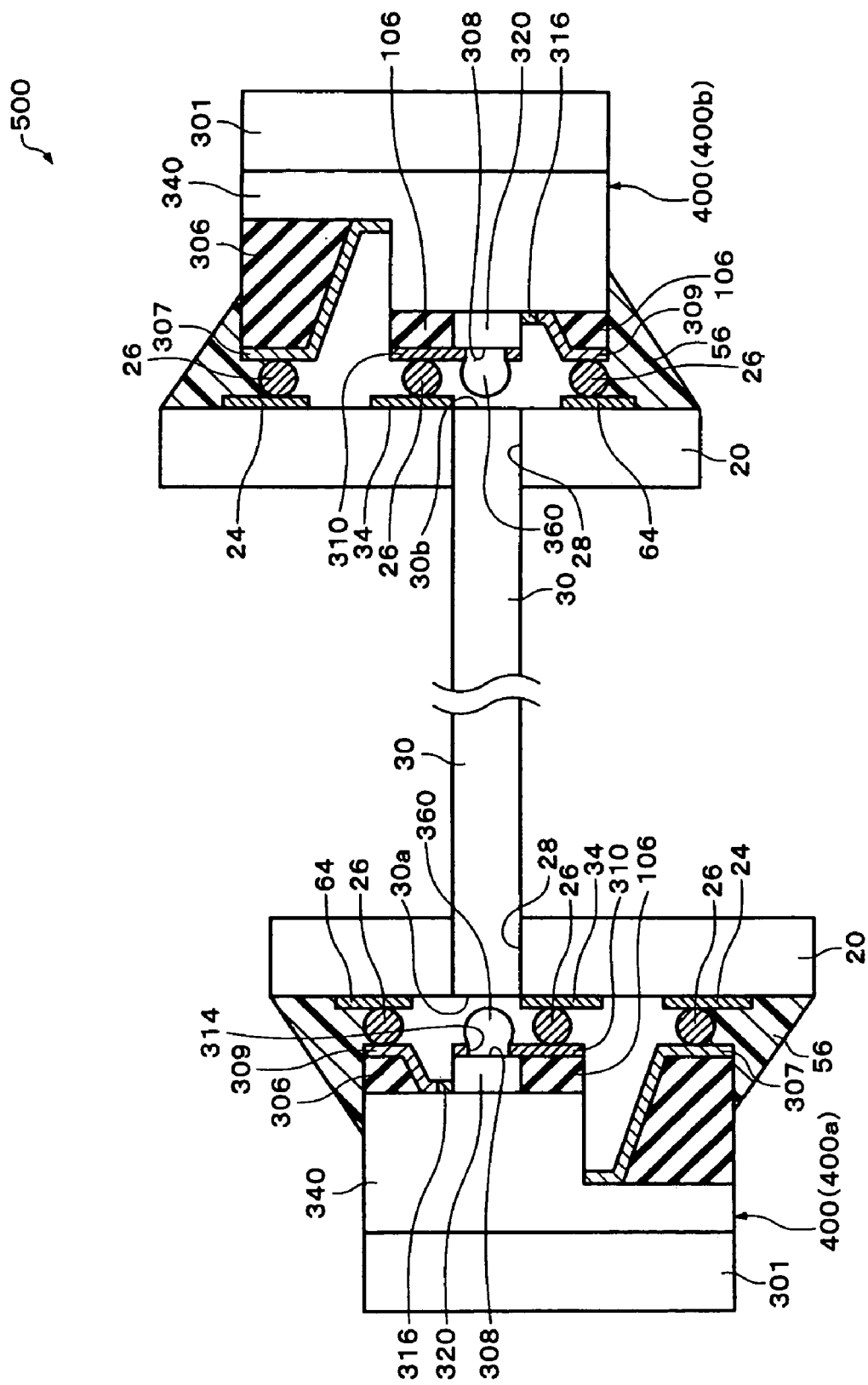
FIG. 15 is a schematic illustrating an optical module according to a fourth exemplary embodiment of the invention.

FIG. 15 is a schematic illustrating an optical module 500 according to a fourth exemplary embodiment of the invention. The optical module 500 includes the electro-optical element 400 (a first electro-optical element 400a, a second electro-optical element 400b), a semiconductor chip 20, and an optical waveguide (an optical fiber 30). In the electro-optical element 400, a light-receiving element part 320 includes a first function of converting the light that is incident on an optical surface 308 from a light-emitting element part 340 to current and a second function of converting the light that is incident on an optical surface 308 from an optical member 360 to current in the same manner of the electro-optical element 300 of the third exemplary embodiment. Hereafter, a construction or a function that is common between the first electro-optical element 400a and the second electro-optical element 400b is described as "400".

In the optical module 500 of the exemplary embodiment, even if the electro-optical element 300 of the third exemplary embodiment is employed instead of the electro-optical element 400, the beneficial effect that is the same as that of the electro-optical element 400 can be achieved. This is applied to a fifth and a sixth exemplary embodiment described later in the same manner.

1. Construction of the Electro-Optical Element

As for the optical module 500, the first electro-optical element 400a and the second electro-optical element 400b are provided to an edge 30a and an edge 30b, respectively, as shown in FIG. 15. The first and second electro-optical elements 400 include the same construction as each other. The first and second electro-optical elements 400 each include the light-emitting element part 340 and the light-receiving element part 320. Each layer constructing the light-emitting element part 340 and the light-receiving element part 320 has nearly the same construction as the light-emitting element part 140 and the light-receiving element part 120 of the electro-optical element 100 shown in FIG. 1 excluding a placement position of the electrode. In FIG. 15, a label of each layer constructing the light-emitting element part 340 and the light-receiving element part 320 is omitted.

As for the electro-optical element 400 shown in FIG. 15, a first electrode 307 and a second electrode 309 function in order to drive the light-emitting element part 340. The second electrode 309 and the fourth electrode 310 function in order to drive the light-receiving element part 320. Also, an opening 314 is formed at a part of a region of the fourth electrode 310 located on the light-receiving element part 320. A bottom of the opening 314 is an optical surface 308.

In addition, an optical member 360 is formed on the optical surface 308. The optical member 360 is made of the same material of and can be formed in the same manner of the optical member 160 of the electro-optical element 100 shown in FIG. 1. As for the first electrode 307 through the fourth electrode 310, a part of each of which is formed on an insulating layer 306. The insulating layer 306 may be a resin, such as a polyimide-type resin, a fluorocarbon-type resin, an acrylic-type resin, an epoxy-type resin or the like, or an insulating material, such as silicon nitride, silicon oxide, silicon nitride oxide or the like.

Each of the first electro-optical element 400a and the second electro-optical element 400b function as a light-receiving element or a light-emitting element respectively. The optical module 500 makes bi-directional communication possible. If the first electro-optical element 400a functions as the light-emitting element and the second electro-optical element 400b functions as the light-receiving element, the light generated in the light-emitting element part 340 of the first electro-optical element 400a emits from the optical surface 308 and is incident on the optical member 360. Then, the light that emits from the optical member 360 in which the light is condensed and is incident on the edge 30a of the optical fiber 30. The incident light transmits through the optical fiber 30 so as to exit from the edge 30b. Subsequently, the light is incident on the optical surface 308 of the second electro-optical element 400b after passing through the optical member 360. Then, the light is absorbed in the light-receiving element part 320 of the second electro-optical element 400b.

Alternatively, if the first electro-optical element 400a functions as the light-receiving element and the second electro-optical element 400b functions as the light-emitting element, the light generated in the light-emitting element part 340 of the first electro-optical element 400b is emitted from the optical surface 308 and is incident on the optical member 360. Then, the light is emitted from the optical member 360 in which the light is condensed and is incident on the edge 30b of the optical fiber 30. The incident light transmits through the optical fiber 30 so as to exit from the edge 30a. Subsequently, the light is incident on the optical surface 308 of the second electro-optical element 400a after passing through the optical member 360. Then, the light is absorbed in the light-receiving element part 320 of the second electro-optical element 400a.

A relative position of the first electro-optical element 400a with respect to the edge 30a of the optical fiber 30 is fixed. A relative position of the first electro-optical element 400b with respect to the edge 30b of the optical fiber 30 is fixed. The optical surface 308 of the first electro-optical element 400a faces the edge 30a of the optical fiber 30. The optical surface 308 of the first electro-optical element 400b faces the edge 30b of the optical fiber 30.

The semiconductor chip 20 is provided in order to drive the electro-optical element 400. Specifically, the semiconductor chip 20 includes a circuit in order to drive the electro-optical element 400. Each wiring pattern 24, 34, 64, that is electrically connected to an inner circuit, is provided in multiple numbers on the semiconductor chip 20.

The semiconductor chip 20 and the electro-optical element 400 are electrically connected. For example, the first electrode 307 and the wiring pattern 24 are electrically connected with a solder 26. Also, the second electrode 309 and the wiring pattern 64 are electrically connected with the solder 26. Additionally, the fourth electrode 310 and the wiring pattern 34 are electrically connected with the solder 26.

In the electro-optical element 400, the semiconductor chip 20 can be face-down mounted.

Accordingly, the solder allows the electro-optical element 400 and the semiconductor chip 20 not only to connect electrically but also to fix each other. As for the connection between each electrode described above and the wiring pattern, a wire or a conductive adhesive may be used instead of using the solder 26.

An interstice between the electro-optical element 400 and the semiconductor chip 20 can be fixed by using a resin 56 as shown in FIG. 15. Thus, the resin 56 has a function that keeps a connecting condition between the electro-optical element 400 and the semiconductor chip 20. In this case, preventing the optical member 360 from covering the resin 56, a refractive index difference between the optical member 311 and its surrounding can be maintained, thereby ensuring a light condensing function of the optical member 360.

A hole 28 (for example, a through hole) is provided to the semiconductor chip 20. The optical fiber 30 is inserted into the hole 28. The hole 28 goes through the semiconductor chip 20 from the surface on which the each wiring pattern 24, 34, 64 is provided to its opposite surface while avoiding the inner circuit. A taper (not shown) may be provided to at least one of an opening edge of the hole. By providing the taper, the optical fiber can be inserted easily into the hole 28.

2. Method to Drive the Optical Module

Figure 16:
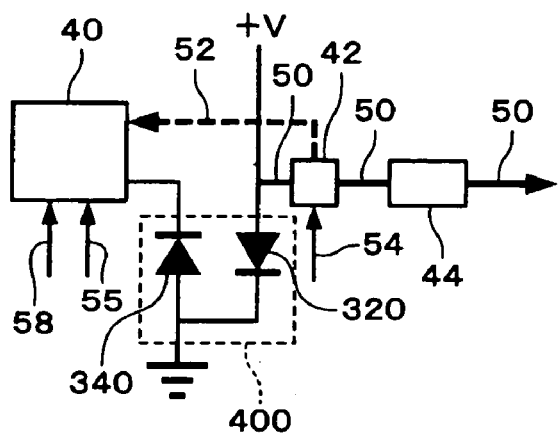
FIG. 16 is a schematic illustrating an example of a drive circuit for an electro-optical element shown in FIG. 15.

The method to drive the optical module 500 shown in FIG. 15 will be described with reference to FIG. 16. FIG. 16 is a diagram schematically illustrating an example of a drive circuit (a principal part) for electro-optical element 400 shown in FIG. 15.

In the optical module 500 shown in FIG. 15, control is carried out so as to interchange a light-transmitting and a light-receiving by time-sharing. As mentioned above, if the first electro-optical element 400*a* functions as the light-emitting element, the control is carried out such that the second electro-optical element 400*b* receives the light generated in the first light-emitting element 400*a*. If the second electro-optical element 400*b* functions as the light-emitting element, the control is carried out such that the first electro-optical element 400*a* receives the light generated in the second light-emitting element 400*b*. The time-sharing is controlled by a clock 54 and a clock 55 that are input into a driver IC 40 and a switching circuit 42 respectively.

The drive circuit for the electro-optical element 400 includes the driver IC 40, the switching circuit 42, and a trans-impedance amplifier (TIA) 44 as shown in FIG. 16. The drive circuit shown in FIG. 16 is provided for every electro-optical element 400. Additionally, in the electro-optical element 400, a bias can be applied for the light-emitting element part 340 and the light-receiving element part 320 in the same direction.

The driver IC is electrically connected to one electrode of the light-emitting element part 340 of the electro-optical element 400. The switching circuit 42 is electrically connected to one electrode of the light-receiving element part 320 of the electro-optical element 400. Another electrode of the light-emitting element part 340 and another electrode of the light-receiving element 320 are grounded as shown in FIG. 16. In addition, a reverse bias is applied to the one electrode of the light-receiving element part 320. The TIA 44 is electrically connected to the switching circuit 42.

The driver IC 40 is provided in order to drive the light-emitting element part 340 of the electro-optical element 400. Specifically, the light generated in the light-emitting element part 340 is emitted while a transmitting signal 58 is input into the driver IC 40. Also, the light-receiving element part 320 can monitor an output of the light generated in the light-emitting element part 340 while the light-emitting element part 340 is operating. Referring to FIG. 16, a movement of the circuit under the operation of the light-emitting element part 340 will be more specifically described below.

If the transmitting signal 58 is input into the driver IC 40, the driver IC 40 starts to drive the light-emitting element part 340. While the transmitting signal 58 is input into the driver IC 40, the output of the light generated in the light-emitting element part 340 is detected by the light-receiving element part 320. The output of the light detected is input into the driver IC 40 as an APC input 52 by the switching circuit 42.

While the transmitting signal 58 is not input into the driver IC 40, the light exited from the edge 30*a* of the optical fiber 30 is incident on the optical surface 108 of the electro-optical element 400 after passing through the optical member 160. Specifically, while the transmitting signal 58 is not input into the electro-optical element 400, the switching circuit 42 is switched to the TIA 44 side (refer to FIG. 16). The TIA 44 has a function of amplifying the receiving signal 50.

As mentioned above, in the optical module 500 of the exemplary embodiment, the first electro-optical element 400*a* and second electro-optical element 400*b* can be controlled by time-sharing such that if the first electro-optical element 400*a* is under a light-emitting state, the second electro-optical element 400*b* becomes a light-receiving state, and if the first electro-optical element 400*a* is under a light-receiving state, the second electro-optical element 400*b* becomes a light-emitting state.

Fifth Exemplary Embodiment

Figure 17:
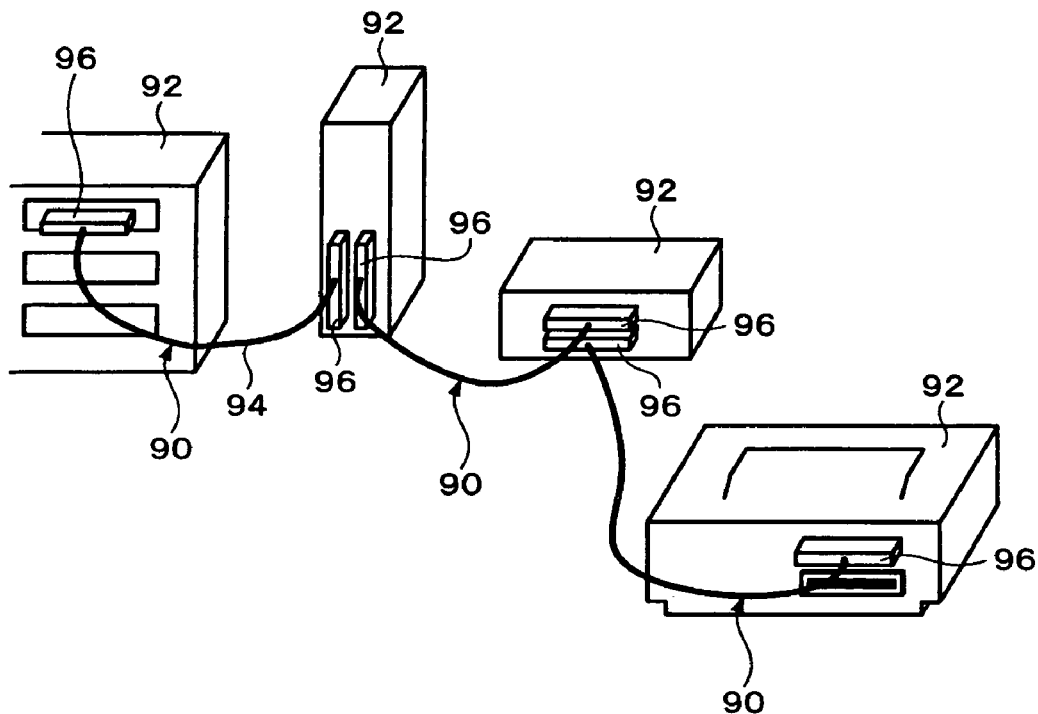
FIG. 17 is a schematic illustrating an optical transmitting device according to a fifth exemplary embodiment of the invention.

FIG. 17 is a schematic illustrating an optical transmitting device according to a fifth exemplary embodiment of the invention. An optical transmitting device 90 interconnects electronic equipment 92, such as a computer, a display, a storage device, a printer or the like. The electronic equipment 92 may be information-communication equipment. The optical transmitting device 90 may include a plug 96 provided at both end of a cable 94. The cable 94 includes the optical fiber 30 (refer to FIG. 15). The plug 96 includes the electro-optical element 400 (400*a*, 400*b*) and the semiconductor chip 20. The optical fiber 30 is included in the cable 94. The electro-optical element 400 and the semiconductor chip 20 are included in the plug 96. Therefore, those are not shown in FIG. 17. A fixing condition between the optical fiber and the electro-optical element 400 is the same manner as described in the fourth exemplary embodiment.

The electro-optical element 400*a* and 400*b* of the fourth exemplary embodiment are provided to both end parts of the optical fiber 30 respectively. If the electro-optical element 400*a* provided to one end of the optical fiber 30 functions as the light-receiving element, after converting a light signal to an electrical signal in the light-receiving element part 120 of the electro-optical element 400*a*, the electrical signal is input into the electronic equipment 92. In this case, the electro-optical element 400*b*, provided to another end part of the optical fiber 30, functions as the light-emitting element.

Thus, the electrical signal output from the electronic equipment 92 is converted to the optical signal in the light-emitting element part 140 of the electro-optical element 400b. The optical signal transmits through the optical fiber 30, inputting into the electro-optical element 400a functioning as the light-receiving element.

As above-mentioned, according to the optical transmitting device 90 of the exemplary embodiment, communication among the electronic equipment 92 can be achieved by the light signal.

Sixth Exemplary Embodiment

Figure 18:
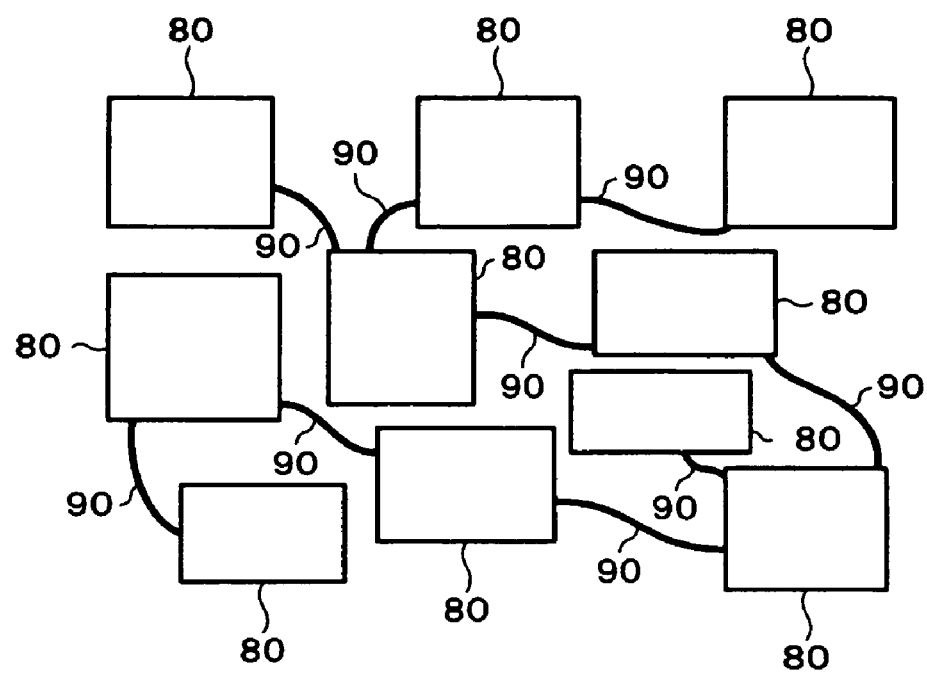
FIG. 18 is a schematic illustrating a usage of a optical transmitting device according to a sixth exemplary embodiment of the invention.

FIG. 18 is a schematic illustrating a usage of an optical transmitting device according to a sixth exemplary embodiment of the invention. The optical transmitting device 90 is connected among electronic equipment 80. As for the electronic equipment, a liquid crystal display monitor or a digital CRT (may be used in field of financial, mail-order, medical care, education), a liquid crystal projector, a plasma, display (PDP), a digital TV, a cash register for retail sales (for point of sales scanning (POS)), a video recorder, a tuner, a game device, a printer or the like are exemplified.

The present invention is not limited to the above-mentioned exemplary embodiments. Various changes can be made.

For example, the present invention may include constructions that are substantively same as those described in the exemplary embodiments (for example, the construction including the same functions, method, and results, or the constructions including the same aims and results). Also, the present invention may include the constructions where non-essential parts of the construction described in the exemplary embodiments are replaced. Also, the present invention may include the constructions achieving the beneficial effects or constructions that are capable of achieving the same aims as those of the constructions described in the exemplary embodiments. Also, the present invention may include constructions adding related arts on the constructions described in the exemplary embodiments.

For example, in the electro-optical element of the above-mentioned exemplary embodiment, while a case where the light-emitting element part includes one columnar part has been described, even if the columnar part is provided in multiple numbers in the light-emitting element part, it does not adversely affect the exemplary embodiments of the invention. Also, if the electro-optical element is provided in multiple numbers in an array, it includes the same effect.

In addition, in the above-mentioned exemplary embodiment, if the p-type and n-type are interchanged in the each semiconductor layer, it does not depart from spirit of the invention. In the above-mentioned exemplary embodiment, while a case of the AlGaAs has been described, in accordance with a oscillation wavelength, another material system, for example, a semiconductor material such as a GaInP (gallium-indium-phosphide) system, a ZnSSe (zic-sulfur-selenide) system, an InGaN (indium-gallium-nitride) system, an AlGaN (aluminum-gallium-nitride) system, an InGaAs (indium-gallium-arsenide) system, a GaInAs (gallium-indium-arsenide) system, a GaAsSb (gallium-arsenide-antimony) system are applicable.

What is claimed is:

1. An electro-optical element, comprising:
   a light-emitting element part;
   a light-receiving element part having an upper surface including an optical surface and formed directly on the light-emitting element part, light being emitted at least in a direction that the light-emitting element part and the light-receiving element part are formed in layers; and
   an optical member provided at least on the optical surface;
   wherein:
   a cross-sectional surface of the optical member cut by a plane parallel to the optical surface being at least one of a circle and an oval;
   at least the upper part of the light-emitting element part has a columnar like shape; and
   a longest diameter of the cross-sectional surface of the optical member being larger than a longest diameter of an upper surface of the light-receiving element part and narrower than a diameter of a columnar part of the light-emitting element part.

2. The electro-optical element according to claim 1, at least the upper part of the light-receiving element part being in a columnar like shape.

3. The electro-optical element according to claim 1, the optical surface being at least one of a circle and the oval and a longest diameter of the cross-sectional surface of the optical member being larger than a longest diameter of the optical surface.

4. The electro-optical element according to claim 1, the optical member being formed by curing a liquid member that is cured by applying an energy.

5. The electro-optical element according to claim 1, the optical member being formed by an acrylic-type ultraviolet curable resin and epoxy-type resin.

6. The electro-optical element according claim 1, the optical member being formed by at least one of an acrylic-type ultraviolet curable resin, or an epoxy-type resin, and a thermosetting polyimide-type resin.

7. The electro-optical element according to claim 1, the light-receiving element part including a function of converting a part of the light emitted from the light-emitting element part into a current.

8. The electro-optical element according to claim 1, the light-receiving element part including a function of converting light that is incident on the optical surface from the optical member into current.

9. The electro-optical element according to claim 5, an optical thickness d of the light-receiving element part satisfying the following condition (1):

$$d = m\,\lambda/2 \tag{1}$$

where a design wavelength of the light-emitting element part is $\lambda$ and m is a natural number greater than or equal to one.

10. The electro-optical element according to claim 1:
   the light-emitting element part including a first mirror, an active layer provided on the first mirror, and a second mirror provided on the active layer; and
   the light-receiving element part including a first contact layer, a light absorption layer provided on the first contact layer, and a second contact layer provided on the light absorption layer.

11. The electro-optical element according to claim 1, the light-emitting element part functioning as a surface emitting semiconductor laser.

12. The electro-optical element according to claim 1, the optical member functioning as a lens.

13. A method to manufacture an electro-optical element, comprising:
   forming a stacked body made up of a light-receiving element part including an optical surface formed directly on a light-emitting element part;
   forming an optical member precursor by ejecting a liquid drop to the optical surface; and forming an optical member by curing the optical member precursor;

wherein:
a cross-sectional surface of the optical member cut by a plane parallel to the optical surface being at least one of a circle and an oval;
at least the upper part of the light-emitting element part has a columnar like shape; and
a longest diameter of the cross-sectional surface of the optical member being larger than a longest diameter of an upper surface of the light-receiving element part and narrower than a diameter of a columnar part of the light-emitting element part.

14. The method to manufacture an electro-optical element according to claim 13, the liquid drop being made of a liquid member that is cured by applying energy.

15. An optical module, comprising:
a first electro-optical element according to claim 1;
a second electro-optical element according to claim 1; and
an optical waveguide, a light emitted from the optical surface of the first electro-optical element transmitting through the optical waveguide, and being incident on the optical surface of the second electro-optical element, and
a light emitted from the optical surface of the second electro-optical element transmitting through the optical waveguide, and being incident on the optical surface of the first electro-optical element.

16. An optical transmitting device, comprising:
the optical module according to claim 15.

17. A method to drive an optical module that includes a first electro-optical element, a second electro-optical element, and an optical waveguide, the first and the second electro-optical elements being the electro-optical element according to claim 1, the method comprising:
controlling the first and the second electro-optical elements such that if the first electro-optical element is under a light-emitting state, the second electro-optical element becomes a light-receiving state, and if the first electro-optical element is under a light-receiving state, the second electro-optical element becomes a light-emitting state.

18. An electro-optical element, comprising:
a light-emitting element part; and
a light-receiving element part having an upper surface including an optical surface and formed directly on the light-emitting element part, light being emitted at least in a direction that the light-emitting element part and the light-receiving element part are formed in layers;

wherein:
a cross-sectional surface of the optical member cut by a plane parallel to the optical surface being at least one of a circle and an oval;
at least the upper part of the light-emitting element part has a columnar like shape;
a longest diameter of the cross-sectional surface of the optical member being larger than a longest diameter of an upper surface of the light-receiving element part and narrower than a diameter of a columnar part of the light-emitting element part; and
an optical thickness d of the light-receiving element part satisfying the following condition (1):

$$d = m\,\lambda/2 \tag{1}$$

where a design wavelength of the light-emitting element part is λ and m is a natural number greater than or equal to one.

19. The electro-optical element according to claim 1, wherein:
the light-receiving element part includes a lower electrode, the lower electrode having an opening through it with a diameter smaller than a longest diameter of a cross-sectional surface of the optical member; and
the light-emitting element part includes an upper electrode, the upper electrode having an opening through it with a diameter greater than a longest diameter of a cross-sectional surface of the optical member.

* * * * *